United States Patent [19]

Feeney

[11] 3,780,431

[45] Dec. 25, 1973

[54] PROCESS FOR PRODUCING COMPUTER CIRCUITS UTILIZING PRINTED CIRCUIT BOARDS

[75] Inventor: James Henry Feeney, Acton, Mass.

[73] Assignee: Bowmar/Ali, Inc., Acton, Mass.

[22] Filed: Sept. 25, 1972

[21] Appl. No.: 292,131

[52] U.S. Cl. .................... 29/626, 29/203 B, 29/627, 174/68.5, 339/17 B, 339/17 C

[51] Int. Cl. .................... H05k 3/30

[58] Field of Search .................... 29/625, 626, 627, 29/630 D, 491, 23 S, 307, 203 J, 203 B, 203 M, 203 W, 203 S; 174/68.5; 317/101 B, 101 C, 101 CC; 313/109 S; 339/17 R, 17 A, 17 B, 17 C, 17 CF, 17 L, 17 LC, 17 LM, 17 M

[56] References Cited

UNITED STATES PATENTS

| | | | |
|---|---|---|---|
| 2,506,047 | 5/1950 | Thomas | 29/626 UX |
| 3,393,449 | 7/1968 | Garcia | 174/68.5 X |
| 3,574,934 | 4/1971 | DeRose | 29/626 |
| 3,641,651 | 2/1972 | Rockwell et al. | 29/203 B |
| 2,965,812 | 12/1960 | Bedford | 317/101 CC |
| 3,161,805 | 12/1964 | Hackler | 317/101 CC |
| 3,324,212 | 6/1967 | Paulley et al. | 264/63 |
| 3,436,605 | 4/1969 | Landron | 317/101 CC |
| 3,440,722 | 4/1969 | Paulson | 29/626 |
| 3,548,493 | 12/1970 | Hubbard | 29/626 |
| 3,588,618 | 6/1971 | Otte | 317/101 CC |
| 3,626,086 | 12/1971 | Rubey | 174/68.5 |
| 3,698,079 | 10/1972 | Lifschitz | 29/625 X |

OTHER PUBLICATIONS

"The Systems Approach to Electronic Wiring & Connections," Methode Manufacturing Corp., 1961, p. 9.

*Primary Examiner*—Richard J. Herbst
*Assistant Examiner*—Joseph A. Walkowski
*Attorney*—John A. Young

[57] ABSTRACT

In a process for producing calculator printed circuit boards, a pallet consisting of a plurality of printed circuit boards are interconnected by snapaway perforated edges at the adjacent side of the boards, so that the pallet consisting of plural boards is processible as a whole. Electrical elements or components have their terminals received through openings in the printed circuit board, which insertion is by machine utilizing a pantographic locating principle. Components are also assembled on the board by hand insertion. After inserting selected electrical components at the desired locations, and masking other locations, the electrical connections are then treated by fountain soldering to form electrical connections between the leads and the printed circuit. The soldering occurs to the pallet as a whole. The individual boards are then snapped apart and the board has enough dimensional stability so that it is rigidly clamped on a fixture and passed over a routing blade at a predetermined slight clearance therefrom so that all of the excess lead sections are trimmed from the subsurface of the printed circuit substrate. Further electrical devices can then be added and soldered in place and the printing circuit board together with its electrical components can then be positioned within a container for a computer application. The described process incorporates minimal handling and incorporates high speed machine assembly techniques wherein multiple operations occur simultaneously or repetitively at high speed.

3 Claims, 9 Drawing Figures

PROCESS FOR PRODUCING COMPUTER CIRCUITS UTILIZING PRINTED CIRCUIT BOARDS

BACKGROUND OF THE INVENTION

There has developed a remarkable demand for a small hand-held calculators because of their convenience in operation, ready accessibility and transportability. It is essential, however, that such a device be manufacturable at a low cost which means that wherever possible, handling must be minimized and the total labor requirement in assembly must be minimized. Assembly procedures must be simplified to the extent that multiple operations can be carried out simultaneously and where possible the assembly procedure must lend itself to high speed repetitive operation. Assembly techniques, including soldering, should occur for multiple units all with a view in mind to reducing the time required for assembly, making it as simple and unsusceptible to error as possible.

The machine for assembling the electrical components onto the printed circuit board must also be susceptible to high speed assembly techniques so that assembly costs will make the calculator practical to manufacture within the United States in spite of the high cost of labor. Otherwise, the resulting high cost of making the computer will overprice the calculator and limit demand.

Although calculators are readily available in the present state of the art, very few are intended for sale at a popular price and are sufficiently inadequate in that they have excessive power requirement. A substantial demand exists for a low price, hand-held low power demand calculator. It is the intent of the present invention that such a calculator can be produced by incorporating novel assembly and manufacturing techniques all of which contribute to the economy, accuracy and convenience of the present invention.

OBJECTS OF THE INVENTION

It is the foremost object of the present invention to provide a novel process for assembling printed circuit boards and electrical components to produce electrical circuitry usable particularly in calculator applications.

Another object of the present invention is to provide a novel method for assembling electrical components on printed circuit boards which are joined together in the form of a pallet, whereby a plurality of such boards are simultaneously moved through assembly procedures as interconnected boards, the boards being then separated from each other at a selected stage of the assembly procedure.

Another object of the present invention is to provide a novel means whereby a removable portion of the printed circuit board serves to protect the connector terminals from the solder during soldering operation.

Another object of the present invention is to provide a unique means for simultaneously removing the excess terminal sections of the electrical components by routing means after the soldering operation is completed.

An important feature of the present invention is that the process lends itself to both machine insertion and manual insertion of electrical components in their proper location through openings in the printed circuit board while the printed circuit boards are still interconnected as a pallet, the electrical components being then soldered in place while the printed circuit boards are still assembled as a pallet thus improving the efficiency and increasing the speed of operation with minimal handling.

The above and other advantages and features of the present invention will become apparent from a consideration of the following description which proceeds with reference to the accompanying drawings wherein a selected example of the invention will be described by way of illustration and not limitation of the invention.

DETAILED DESCRIPTION OF THE INVENTION

Figure 1:
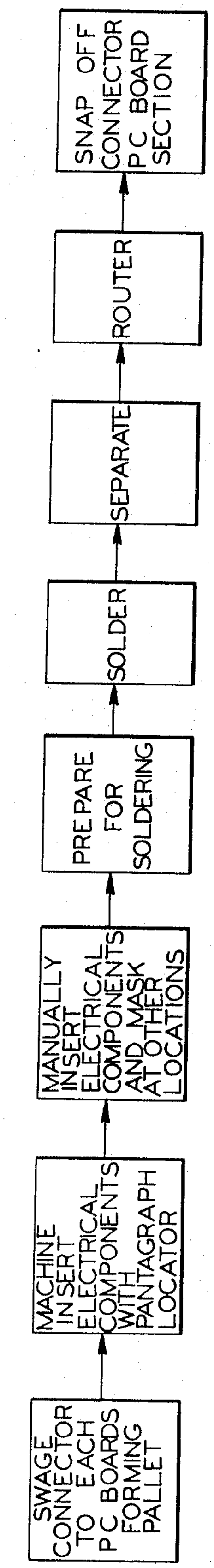
FIG. 1 is a block diagram of the process for producing a calculator circuit utilizing printed circuit boards which are interconnected in pallet form.
Figure 3:
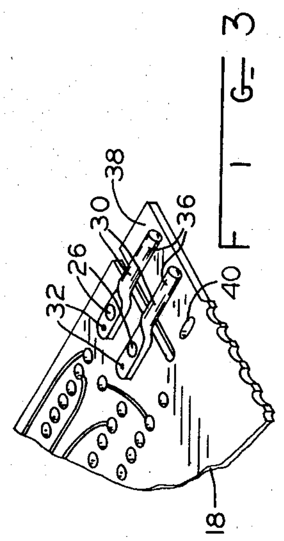
FIG. 3 illustrates a fragmentary part of the pallet with the electrical connector staked at its proper location on the printed circuit board and providing an electrical inlet for the computer circuit.

Initially, the printed circuit board sections are connected in groups of three, four or more to form a pallet 10. The printed circuit board sections are indicated by reference numerals 12, 14, 16 and 18.

These printed circuit board sections will all be identically processed to form the same calculator circuit when the assembly procedure is completed. However, for accuracy of assembly, increasing the speed, and making assembly more convenient the four sections comprising printed circuit boards 12, 14, 16 and 18 are simultaneously carried as an interconnected unit through the successive stations of assembly. It should be noted that the pallet has perforated sections 20 which permit each printed circuit board section to be snapped apart one from the other along the perforations and there is an occasional elongated opening 21 so that when the board sections are broken apart there will be formed notches along the edges of the boards which serve as means for locating and connecting the boards within the interior of the casing of the calculator. Thus, the pallet 10 comes preformed with the printed circuitry, the perforations which are the breakage points for the boards and the openings 21 to form the necessary notched areas which serve to locate and secure the printed circuit board in place.

At the first stage of assembly, there is staked into openings 24 eyelets 26 and there is then swaged into the eyelets, pins which are part of the electrical connector 30. The electrical connector 30 includes further pins 32 which are received through openings 34 which serve to prevent the connector tines 36 from turning relatively to the printed circuit board, and also serve as a backup in making an electrical connection to the calculator circuit.

The tines are laterally offset and overlie a section 38 of the printed circuit board which serves to protect the tines from solder during the soldering operation after which these sections 38 are readily snapped away. It will be noted that the section 38 is connected to the body of the printed circuit board through a perforated section 40.

After the connector is assembled there is then received through openings 42 of the printed circuit board the various electrical components including those elements which produce the required functions for the computer circuit.

Typically, the component interconnections, and electrical values may be those described and contained in copending application entitled "Calculator Display Circuit" assigned to the same assignee as the present application, designated Application Ser. No. 256,286, filed on May 24, 1972.

Certain of the electrical components are assembled by machine, using a pantograph locator to facilitate assembly and permitting rapid, repetitive operation since the same electrical components are inserted first in one printed board section of the pallet and then the adjacent printed board sections of the same pallet. The pallets are continuously moved to the successive machine-component-assembly stations and the operation occurs in rapid sequence.

Figures 2, 4:
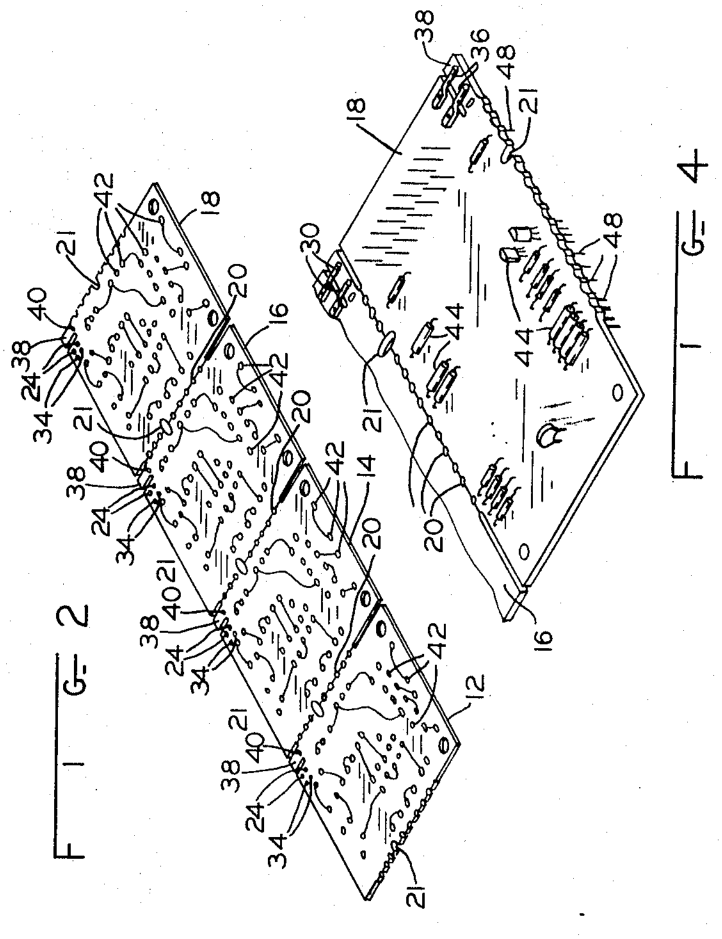
FIG. 2 is an isometric view showing the pallet which is made up of a number of printed circuit boards, the boards being perforated at their interconnected edges whereby each printed circuit board can be easily snapped apart at a selected stage of assembly.
FIG. 4 illustrates in fragmentary view a part of the pallet with one printed circuit board having its machine and hand assembled electrical components, and masking, and now ready for soldering.
Figure 8:
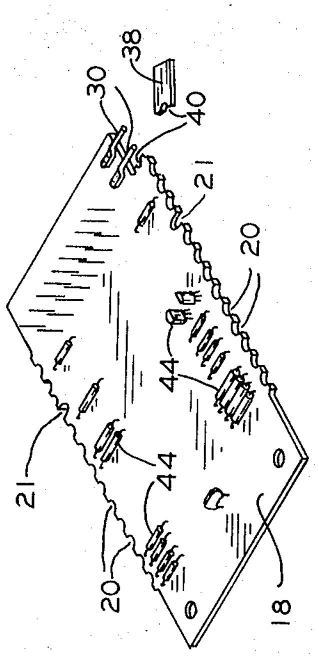
FIG. 8 illustrates breaking away the board section which has protected the tines of the electrical connector from the fountain of solder during the soldering operation, this section of the printed circuit board being no longer necessary; and, FIG. 9 is an assembly perspective view of a finished calculator.

After the pallets 12 have moved through the various stations at which machine operation is used to effect the insertion of electrical components (designated generally by reference numeral 44) at the various stations, the pallets are then transferred together with the assembled electrical components to various stations where other electrical components are manually inserted in place, with the electrical connectors (FIG. 4) extending considerably through the openings 42, such extensions being indicated by reference numeral 48 in FIG. 4.

Figure 5:
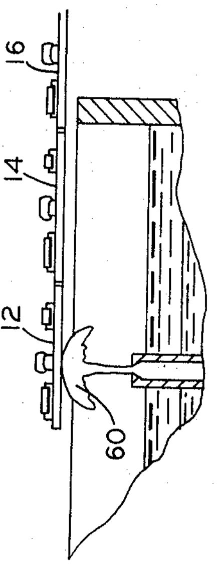
FIG. 5 illustrates the soldering operation in which the pallet is passed through a solder fountain.

After all of the selected electrical components are positioned by machine and manual operation, the pallet 12 and electrical components are then prepared for soldering by first heating, and the pallet 12 is then (FIG. 5) passed over a fountain 60 of solder and oil.

Typically, the solder composition consists of 60–63 parts by weight lead, and 40–37 parts of lead. The solder temperature, while subject, of course, to considerable variation can be maintained between about 470° – 500° F. to form a very satisfactory solder connection between the printed circuit section and that portion of the connector of the electrical component extending through the openings in the printed circuit board.

Figure 6:
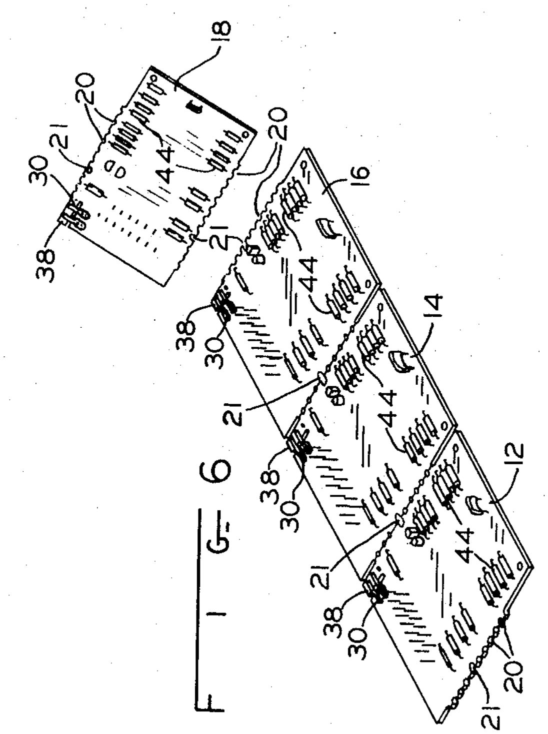
FIG. 6 illustrates the soldered electrical components on the printed circuit boards with one of the boards now being broken away.

During soldering, the electrical components may be held in place by beanbags (not shown). After soldering, the beanbags are removed, the pallets are then degreased and the printed circuit board sections are then broken apart as indicated in FIG. 6.

The excess leads on electrical components are next trimmed away. This being next described in connection with FIG. 7.

Figures 7, 9:
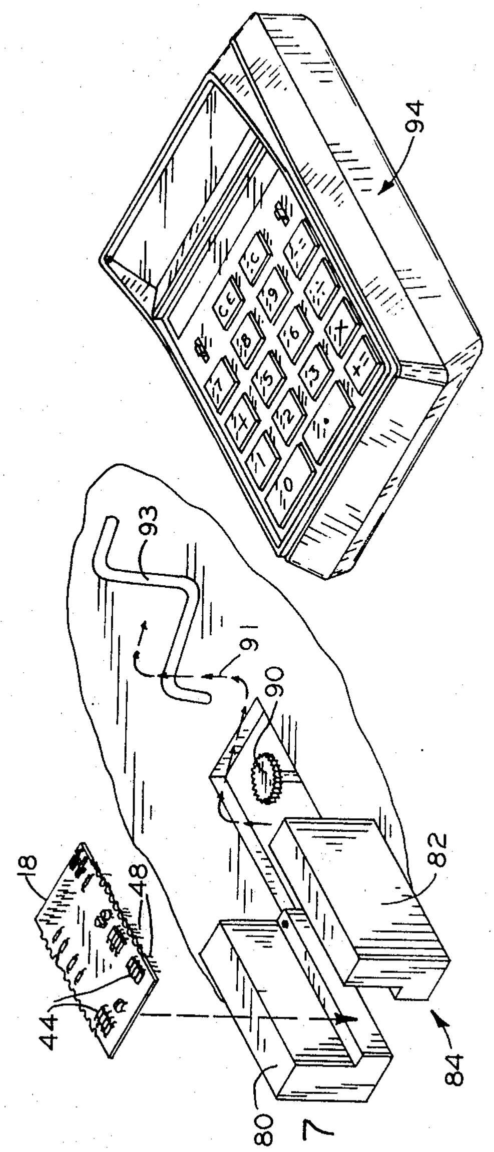
FIG. 7 illustrates in schematic form the apparatus for routing the excess terminal sections of the electrical components, this occurring closely adjacent the soldered connections.

Referring next to FIG. 7, the now removed printed circuit board 18 is received between two clamping members 80, 82 of a fixture. In the process of fitting the printed circuit board into the fixture 84 a microswitch (not shown) is actuated permitting operation of a router designated generally by reference numeral 90. In order for the routing to be effective the printed circuit board must pass a small but closely held tolerance distance from routing cutter blades 90 which rotate at a high speed to effect severing of the unneeded connector sections 48 depending as shown in FIG. 4.

To obtain a close tolerance trim, each circuit board must have dimensional stability and hence it is constructed typically of an epoxy-fiberglass material giving it sufficient rigidity so that it will not easily bend or warp.

The reason for individually treating each printed circuit board is that the perforated sections connecting respective ones of the printed circuit boards would permit excess bending and thus the router might, because of bending at the perforated connecting edges, inadvertently cut certain of the electrical connections. Therefore, the routing occurs for individual printed circuit board sections.

After the individual printed circuit board is clamped in place the fixture 84 then moves back and forth and across the routing blade 90 as indicated by the dashed arrow line 91 a fixed but slight distance above the blade 90 thus causing a severing of all of the leads and when the fixture has traversed its assigned path as determined by the slot 93 it contacts at the termination of the slot a second microswitch (not shown) which prevents further movement of fixture until the now treated circuit board is removed, thus providing a safety feature preventing inadvertent exposure of the operator to the cutting blade sections of the router.

After the printed circuit board is thus formed, the board can then be further fitted with additional electrical components if needed and assembled into a casing together with a keyboard, an electro-luminescent display, driver, power means and clock means which make up the complete calculator designated generally by reference numeral 94 in FIG. 9.

It should be noted that the routing described in connection with FIG. 7 is accomplished with a routing machine ME–612V manufactured by AID of Racine, Wisconsin. The degreaser is provided by Baron-Blakeslee, Chicago, Illinois. The Hallis Engineering Company of Nashua, New Hampshire provides the soldering machine TDC–10.

OPERATION

In operation, the process continues semi-continuously with the pallets, consisting of plurally interconnected printed circuit boards, separately but consecutively fitted with electrical components to make the calculator circuit, the pallet then moving as a whole from one station to the next until all the machine-and-manually placed electrical components are in position. The pallets and assembled components are then simultaneously wave soldered in the manner described in FIG. 5; the printed circuit boards are then snapped apart, at their perforated connections with adjoining printed circuit board sections, and the openings 21 located at the perforated line connection produces a notch or other profile adapted from mounting the board within the casing of the calculator.

The process lends itself to high speed accurate assembly procedures which involve minimal labor, and each calculator circuit is producible economically and accurately.

Although the present invention has been illustrated and described in connection with a single example embodiment, it will be understood that these are illustrative of the invention and are by no means restrictive thereof. It is reasonably to be expected that those skilled in this art can make numerous revisions and adaptations of the invention and it is intended that such revisions and adaptations will be included within the scope of the following claims as equivalents of the invention. For example, the configuration, size, thickness, composition of the printed circuit board is a matter of design preference, all that is required is that the printed circuit board have dimensional stability, strength and sufficient uniform construction so that it will interface with the casing of the calculator and be held by the fixture of the router so that the routing will be precise and will not inadvertently severe any electrical connection at the time that the excess leads are removed.

What I claim is:

1. In a process for producing circuit boards for calculators and the like, the steps of supplying a pallet consisting of a plurality of identical circuit board sections which are interconnected through adjacent perforated adjoining edges, such perforations being sufficiently close together to allow breakage of the pallet sections apart, inserting electrical elements at selected locations in respective ones of said printed circuit board sections while such sections are joined together and with terminal portions of said elements extending through openings in said circuit board and projecting from the underside of the respective circuit board sections, shielding some of said electrical elements with a snap-a-way section of said printed circuit board sections, passing the pallet including the printed circuit board sections over a soldering fountain, separating the respective circuit boards from each other by snapping them apart at their perforated adjoining edges, and thereafter passing individual circuit board sections across a cutting element which is located a fixed predetermined clearance from the undersurface of the circuit board sections to effect trimming of the extended nonfunctional terminals which are soldered at the subsurface of the printed circuit board section.

2. The process in accordance with claim 1 including the step of snapping out the snap-a-way section of said printed circuit board after soldering during which the electrical circuit elements on the printed circuit board have been shielded.

3. The process in accordance with claim 1 wherein said electrical elements are machine inserted endwise through the openings of such printed circuit board sections at locations in accordance with pantographic operation.

* * * * *